(12) United States Patent
Clerc et al.

(10) Patent No.: US 7,236,031 B2
(45) Date of Patent: Jun. 26, 2007

(54) FAST BISTABLE CIRCUIT PROTECTED AGAINST RANDOM EVENTS

(75) Inventors: Sylvain Clerc, Grenoble (FR); Philippe Roche, Le Versoud (FR); Francois Jacquet, Froges (FR)

(73) Assignee: STMicroelectronics SA, Montrogue (FR)

( * ) Notice: Subject to any disclaimer, the term of this patent is extended or adjusted under 35 U.S.C. 154(b) by 69 days.

(21) Appl. No.: 11/159,818

(22) Filed: Jun. 23, 2005

(65) Prior Publication Data

US 2005/0285650 A1    Dec. 29, 2005

(51) Int. Cl.
*H03K 3/356* (2006.01)
(52) U.S. Cl. ...................... 327/210; 327/215
(58) Field of Classification Search ........ 327/210–212, 327/215
See application file for complete search history.

(56) References Cited

U.S. PATENT DOCUMENTS 3,676,702 A * 7/1972 McGrogan, Jr. ............. 327/68
5,719,513 A * 2/1998 Kusumoto et al. .......... 327/215
6,058,041 A   5/2000 Golke et al.
6,735,110 B1  5/2004 Lesea
2003/0122602 A1 7/2003 Ta et al.

OTHER PUBLICATIONS

Preliminary Report FR 0406952.
Monnier, et al. "Flip-Flop Hardening for Space Applications"; Memory Technology, Design and Testing, 1998. Proceedings. International Workshop on San Jose, CA; 1998; pp. 104-107; IEEE; USA.

* cited by examiner

*Primary Examiner*—Kenneth B. Wells
(74) *Attorney, Agent, or Firm*—Hogan & Hartson LLP

(57) ABSTRACT

A bistable circuit includes a first inverter and a capacitive inversion circuit having one input coupled to an output of the first inverter. The capacitive inversion circuit includes a second inverter and a capacitive circuit parallel-coupled to the input and an output of the capacitive inversion circuit. The bistable circuit also includes a switch to isolate the output of the capacitive inversion circuit from an input of the first inverter when the switch receives an active validation signal or, if not, to couple the output of the capacitive inversion circuit to the input of the first inverter.

10 Claims, 2 Drawing Sheets

FAST BISTABLE CIRCUIT PROTECTED AGAINST RANDOM EVENTS

RELATED APPLICATION

The present application claims priority of French Patent Application No. 0406952 filed Jun. 25, 2004, which application is incorporated herein in its entirety by this reference.

BACKGROUND OF THE INVENTION

1. Field of the Invention

In an integrated circuit, the invention relates to a bistable circuit that is protected against logic random events and is fast. The bistable circuit may be used especially to make a latch toggle circuit (or latch trigger circuit), a flip-flop toggle circuit (or flip-flop trigger circuit), an SRAM cell, etc. A prior art bistable circuit comprises two inverters coupled upside down to each other and is used to memorize a piece of logic data.

2. Description of the Prior Art

The constant and gradual miniaturization of electronic circuits is making it possible to obtain circuits that perform increasingly well and are ever smaller. As a tradeoff, these circuits are more sensitive to their environment which may give rise to logic random events.

A logic random event is a change in logic state at a specific time or an undesired transitional logic state, at a point of the integrated circuit. Logic random events may have a wide variety of causes and consequences. In a bistable circuit for example, a random event gives rise to a change in content (logic data) of the bistable circuit which would have to be reprogrammed in order to recover its initial value.

To protect bistable circuits, there is a prior art method, described especially in the patent FR 2 833 783, for coupling a capacitive bridge between an input point E and an output point S of the bistable circuit (FIG. 1).

The capacitive circuit increases the critical load of the circuit. It accordingly increases the energy needed by the circuit in order to make it switch over and increases the switch-over time of the bistable circuit. Since random events generally have limited energy, this energy is no longer sufficient to make the bistable circuit flip over, and the bistable circuit is thus protected against random events. However, to program the bistable circuit, i.e. to deliberately prompt the change in logic state of the bistable circuit, it is necessary to provide far greater energy, necessary to load the capacitive bridge, and it is necessary to have much more time than when there is no capacitive bridge. This is also the case obviously for any circuit using a bistable circuit especially for a latch toggle circuit or a flip-flop toggle circuit.

SUMMARY OF THE INVENTION

According to an embodiment of the present invention, a bistable circuit is both protected against logic random events and is fast during a normal change in logic state (relative to the programming of the bistable circuit).

According to an embodiment of the present invention, a bistable circuit comprises a first inverter and a capacitive inversion circuit having one input coupled to an output of the first inverter; the capacitive inversion circuit comprises a second inverter and a capacitive circuit parallel-coupled to the input and an output of the capacitive inversion circuit; the bistable circuit further comprises a means to isolate the output of the capacitive inversion circuit from an input of the first inverter when said isolation means receives an active validation signal or, if not, to couple said output of the capacitive inversion circuit to the input of the first inverter. The isolation means thus enables the isolation of the capacitive inversion circuit of the input of the first inverter during the programming of the bistable circuit. It is thus no longer necessary to charge the capacitors of the capacitive inversion circuit to program the bistable circuit in such a way that the programming is fast. Outside a programming phase, the isolation means couples the capacitive inversion circuit to the input of the first inverter. The bistable circuit is thus protected against random events by the capacitors of the inversion circuit.

The present invention also relates to a latch toggle circuit embodiment and a flip-flop toggle circuit embodiment comprising at least one bistable circuit as described here above.

BRIEF DESCRIPTION OF THE DRAWINGS

Other features and advantages of the invention shall appear more clearly from the following description of a latch toggle circuit and a flip-flop toggle circuit according to the invention. This description is given by way of an indication that in no way restricts the scope of the invention and is made with reference to the appended drawings, in which.

DETAILED DESCRIPTION

In a prior art bistable circuit (FIG. 1), two inverters I1, I2 are coupled upside down to each other and a capacitive circuit (in the example of FIG. 1, two capacitors C1, C2 in series) is coupled in parallel with the two common points E, S of the two inverters I1, I2. To program a bistable circuit of this kind, the data to be stored is applied to the point E for a period of time that is long enough to charge the inverters C1, C2 and then, if need be, make the inverters I1, I2 switch over.

According to a first embodiment of the invention (FIG. 2), a switch INT is inserted between the input of the inverter I1 and the output of the inverter I2, the capacitive circuit C remaining coupled to the output of the inverter I1. The switch is controlled by a validation signal GATE. The inverter I2 and the capacitive circuit together form a capacitive inversion circuit having high input capacitance, and the switch form the isolation means.

Figure 1:
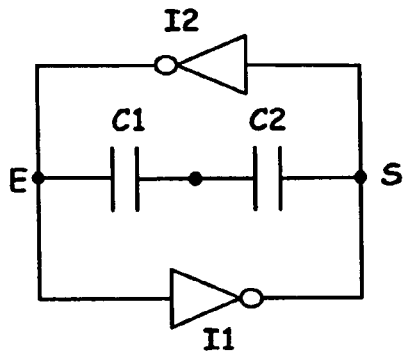
FIG. 1, which has already been described, gives a schematic view of a prior art bistable circuit.

To program the bistable circuit, the desired logic data zero or one is applied to the input E after the switch INT has been opened so that the capacitive charge perceived from the point E is limited to that of the inverter I2 which is far smaller than that of the assembly formed by the inverters I2, I2 and the capacitive circuit of the bistable circuit of FIG. 1. The programming time, in practice the transit time through the inverter I1 of the signal applied to the input E, is thus far smaller. Tests have thus shown a gain in time of about 40%. After programming, the switch INT is closed: the two inverters I1, I2 are again coupled upside-down to each other and the capacitive circuit C plays its role of protector against untimely random events.

According to a second embodiment of the invention (FIG. 3), the capacitive inversion circuit and the isolation means are formed together by a three-state inverter having an input capacitance. To put it in detail, the inversion circuit comprises two P type transistors T3, T4 and two N type transistors T5, T6 series-coupled between a power supply source VDD and a ground of the circuit. The common point of the transistors T4, T5 is coupled to the input E of the inverter I1 whose output is coupled to the gates of T3, T4. A capacitor C3 is coupled between the common point of the transistors T3, T4 and the output of the inverter I1 and a capacitor C4 is coupled between the common point of the transistors T5, T6 and the output of the inverter I2. Finally, the signal GATE is applied to the gate of the transistor T5 and a signal inverse/GATE is applied to the gate of the transistor T4.

Figure 2:
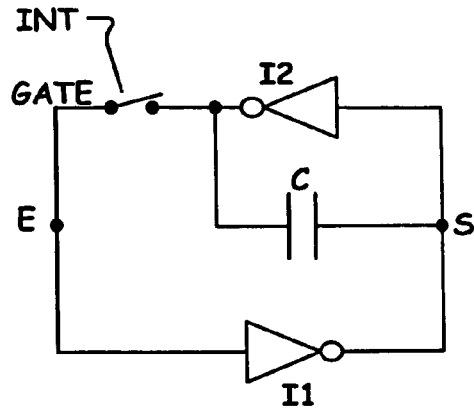
FIG. 2 is a detailed view of a first bistable circuit according to the invention.
Figure 3:
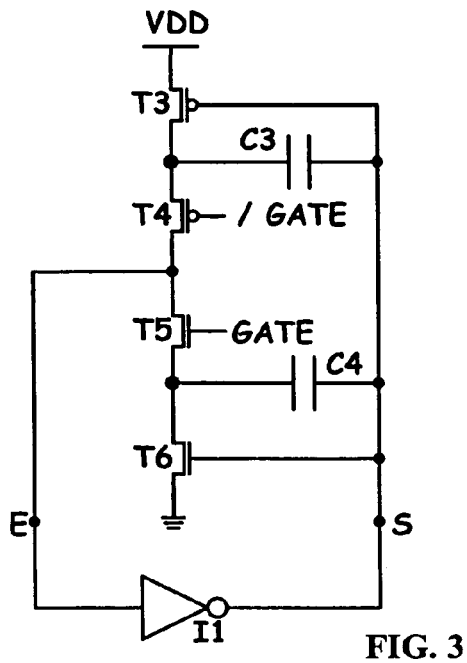
FIG. 3 is a detailed view of a second bistable circuit according to the invention.

The working of the circuit of FIG. 3 is similar to that of FIG. 2. During a programming operation, with the signal GATE active, the transistors T4, T5 are off so that the capacitors C3, C4 are isolated from the input point E of the inverter I1. There is therefore no need to charge them in order to program the bistable circuit. Conversely, outside a programming operation, the signal GATE is inactive, the transistors T4, T5 are on so that the capacitors are coupled to the input point E, thus protecting the bistable circuit against random events.

Figure 4:
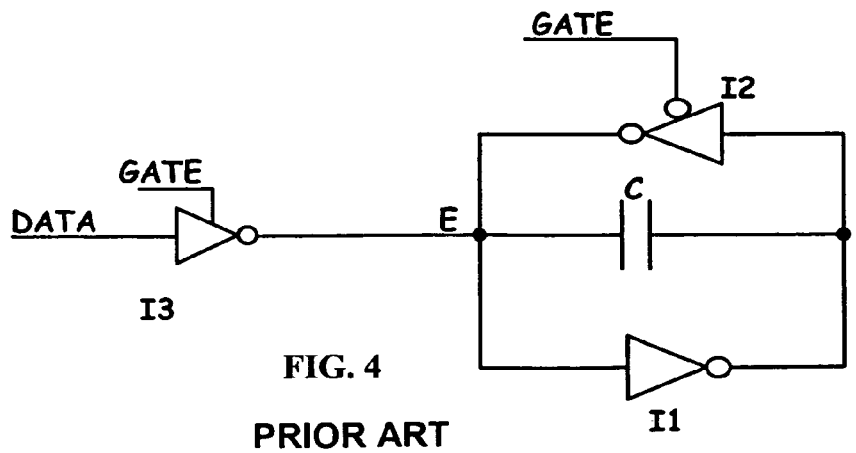
FIG. 4 is a diagram of a prior art latch toggle circuit.
Figure 5:
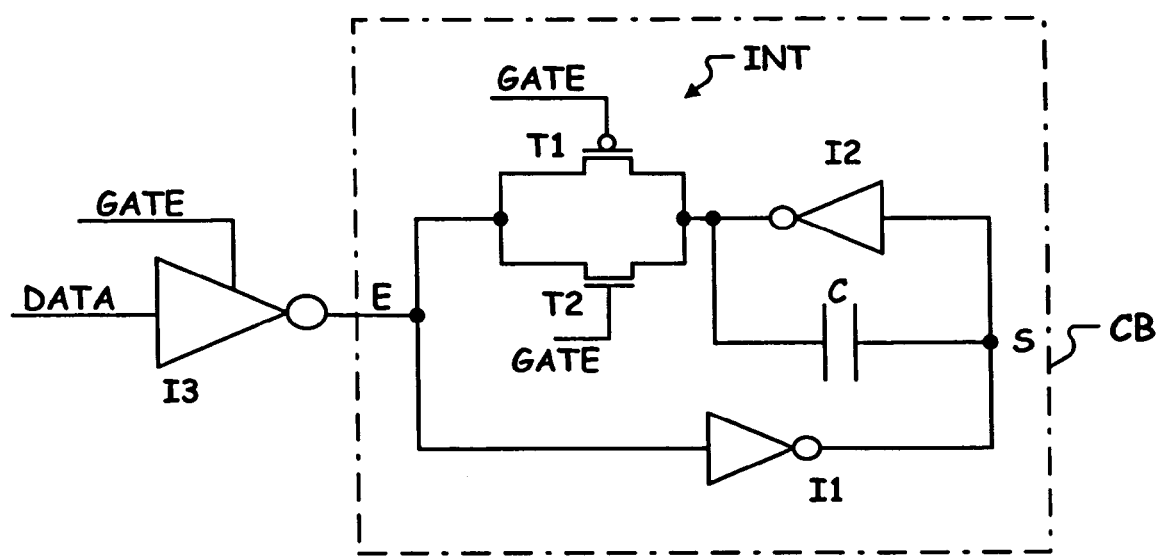
FIG. 5 is a drawing of a latch toggle circuit according to the invention.

FIG. 4 shows a prior art latch toggle circuit comprising a bistable circuit according to FIG. 1 and a control inverter I3, having one output coupled to the input E of the bistable circuit. I3 is a three-state inverter: at its output, it transmits a signal present at its input DATA only when it receives an active validation signal GATE. The inverter I1 of the bistable circuit is in this case a three-state inverter controlled by a signal that is the reverse of the signal GATE. To program a circuit of this kind, a piece of data DATA to be memorized is applied to the input of the inverter I3 and the enabling signal GATE is activated to apply the data to the input E. The inverter I2 is off (through the reverse signal of the signal GATE). After the capacitors C1, C2 have been charged, the data at the point E is transmitted to the point S by the inverter I2. After programming, the signal GATE is deactivated and the inverter I1 is looped to the inverter I2.

In a latch toggle circuit according to the invention, the bistable circuit of a prior art latch toggle circuit is replaced by a bistable circuit CB according to the invention (FIGS. 2, 3) comprising an insulation means.

Thus, in the example of FIG. 4, the three-state inverter is replaced by a simple inverter I2 and a switch INT is inserted between the output of the inverter I2 and the input of the inverter I1, the capacitor C1 remaining coupled to the input of the inverter I2.

In the example of FIG. 4, the switch INT is a CMOS type transmission/transfer gate comprising a P type transistor T1 and an N type transistor T2 that are parallel-coupled, the common drain of T1, T2 being coupled to the output E of the inverter I3 and the common source of T1, T2 being coupled to the input of the inverter I1 and the capacitor C1. The signal GATE and /GATE (the reverse of GATE) are applied to the gates of T1, T2 so that:

when the inverter I3 is on (GATE active), the transistors T1, 2 are off (switch open),
when the inverter I3 is off (GATE inactive), the transistors T1, T2 are on (switch closed).

Figure 6:
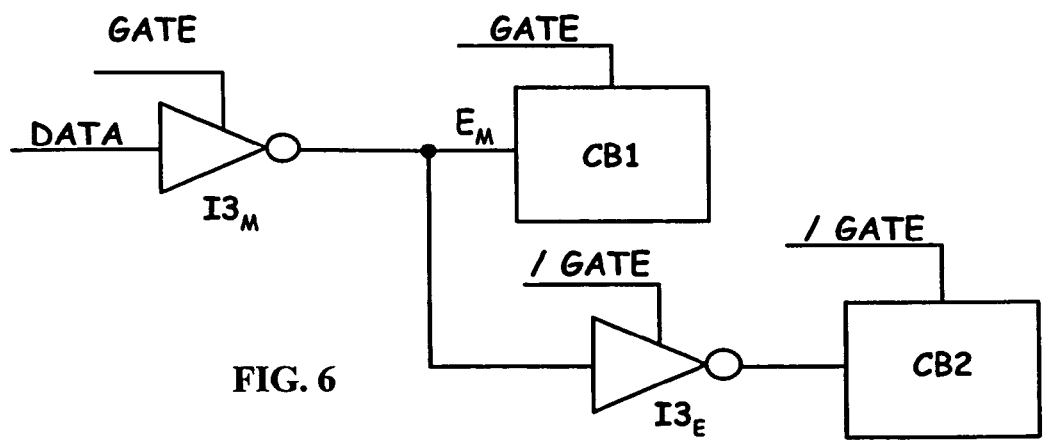
FIG. 6 is a diagram of a flip-flop toggle circuit according to the invention.

FIG. 6 gives a detailed view of a flip-flop type toggle circuit according to the invention. The flip-flop toggle circuit is made in practice by means of two associated latch toggle circuits. One is commonly called the master toggle and the other is called the slave toggle. The bistable circuits CB1, CB2 of the master and slave toggles are not described in detail. They may, for example, comply with FIG. 2 or FIG. 3.

The input DATA of the master latch circuit forms the input of the flip-flop circuit to which data to be stored is applied. The input of the slave latch circuit for its part is coupled to the output $E_M$ of the master latch circuit. The master latch circuit is controlled by the signal GATE which is applied to the control input of the inverter $I3_M$ and to the switch $INT_M$ of the master latch circuit. The slave latch circuit is controlled by the signal /GATE which is the reverse of the signal GATE. The signal /GATE is applied to the inverter $I3_E$ and to the switch $INT_E$ of the slave latch circuit.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A bistable circuit comprising:
    a first inverter having an input forming the input of the bistable circuit and an output forming the output of the bistable circuit;
    a capacitive inversion circuit having one input coupled to the output of the first inverter, the capacitive inversion circuit including a second inverter and a capacitive circuit parallel-coupled to the input and an output of the capacitive inversion circuit; and
    means to isolate the output of the capacitive inversion circuit from the input of the first inverter when said isolation means receives an active validation signal or, if not, to couple said output of the capacitive inversion circuit to the input of the first inverter.

2. The bistable circuit according to claim 1, wherein the isolation means comprises a switch having a terminal coupled to the output of the capacitive inversion circuit and having another terminal coupled to the input of the first inverter, the opening of said switch being controlled by the validation signal.

3. The bistable circuit according to claim 2, wherein the switch is a transmission/transfer gate controlled by the validation signal and comprising a first P type transistor and a second N type transistor that are coupled in parallel.

4. A bistable circuit comprising:

a first inverter;

a capacitive inversion circuit having one input coupled to an output of the first inverter, the capacitive inversion circuit including a second inverter and a capacitive circuit parallel-coupled to the input and an output of the capacitive inversion circuit; and means to isolate the output of the capacitive inversion circuit from an input of the first inverter when said isolation means receives an active validation signal or, if not, to couple said output of the capacitive inversion circuit to the input of the first inverter, wherein the capacitive inversion circuit and the isolation means comprise a three-state inverter controlled by the validation signal.

5. The bistable circuit according to claim 4, wherein the three-state inverter comprises:

a third P type transistor and a fourth P type transistor series-coupled between a power supply source and the output of the inversion circuit coupled to the input of the first inverter, a control gate of the third transistor being coupled to the input of the inversion circuit and a signal that is the inverse of the validation signal being applied to a gate of the fourth transistor;

a fifth transistor and sixth transistor series-coupled between the output of the inversion circuit and a ground of the circuit, a gate of the fifth transistor being coupled to the input of the inversion circuit and the validation signal being applied to a gate of the sixth transistor;

a first capacitive circuit coupled between the input of the inversion circuit and the common point of the third transistor and of the fourth transistor; and a second capacitive circuit coupled between the input of the inversion circuit and the common point of the fifth transistor and of the sixth transistor.

6. A bistable circuit comprising:

a first inverter;

a capacitive inversion circuit having one input coupled to an output of the first inverter, the capacitive inversion circuit including a second inverter and a capacitive circuit parallel-coupled to the input and an output of the capacitive inversion circuit;

means to isolate the output of the capacitive inversion circuit from an input of the first inverter when said isolation means receives an active validation signal or, if not, to couple said output of the capacitive inversion circuit to the input of the first inverter, and a three-state input inverter, one input of which forms an input of the bistable circuit and one output of which is coupled to the input of the first inverter of the bistable circuit.

7. The bistable circuit according to claim 6, to which the validation signal is applied in order to control the three-state inverter and isolate the output of the inversion circuit from the input of the first inverter of the bistable circuit.

8. The bistable circuit according to claim 7, further comprising an additional bistable circuit such that the combination thereof comprises a master-slave toggle circuit.

9. A bistable circuit comprising:

a first inverter having an input forming the input of the bistable circuit and an output forming the output of the bistable circuit;

a switch coupled between the input of the bistable circuit and an intermediary node;

a second inverter having an input coupled to the output of the bistable circuit and an output coupled to the intermediary node; and a capacitor coupled between the intermediary node and the output of the bistable circuit.

10. A bistable circuit comprising:

an inverter coupled between a first node and a second node;

a first P type transistor having a source coupled to a source of supply voltage, a gate coupled to the second node, and a drain;

a second P type transistor having a source coupled to the drain of the first P type transistor, a gate for receiving an inverted gate signal, and a drain coupled to the first node;

a first N type transistor having a source coupled to ground, a gate coupled to the second node, and a drain;

a second N type transistor having a source coupled to the drain of the first P type transistor, a gate for receiving a gate signal, and a drain coupled to the first node;

a first capacitor coupled between the drain of the first P type transistor and the second node; and a second capacitor coupled between the drain of the first N type transistor and the second node.

* * * * *

UNITED STATES PATENT AND TRADEMARK OFFICE
CERTIFICATE OF CORRECTION

| | | |
|---|---|---|
| PATENT NO. | : 7,236,031 B2 | Page 1 of 1 |
| APPLICATION NO. | : 11/159818 | |
| DATED | : June 26, 2007 | |
| INVENTOR(S) | : Sylvain Clerc, Philippe Roche and Francois Jacquet | |

It is certified that error appears in the above-identified patent and that said Letters Patent is hereby corrected as shown below:

On the Title Page (30)
Add --Foreign Application Data--

June 25, 2004  (FR)  0406952

Signed and Sealed this

Twenty-eighth Day of August, 2007

JON W. DUDAS
*Director of the United States Patent and Trademark Office*